July 29, 1969 C. W. RAINER 3,457,937
FLUID CIRCUIT
Filed Aug. 15, 1967
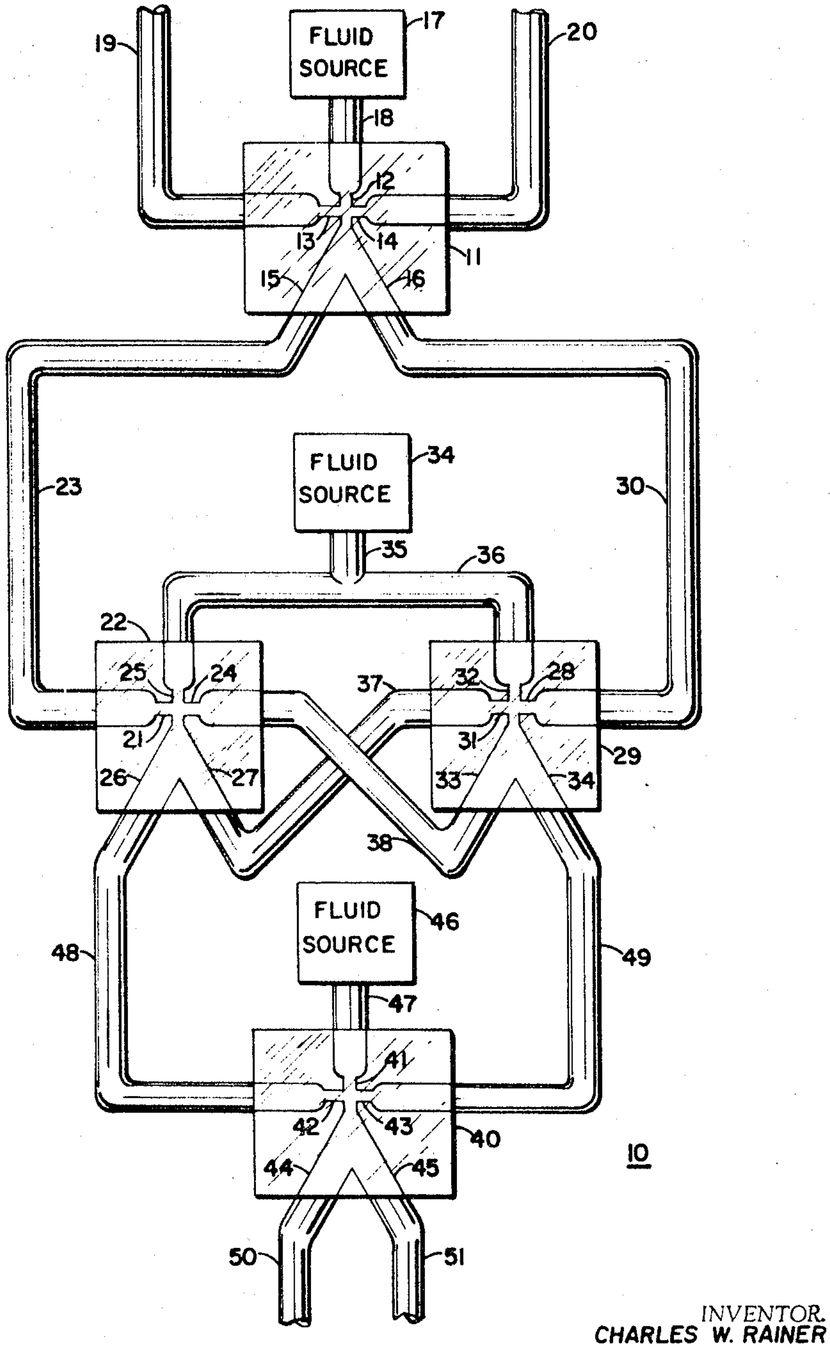
INVENTOR.
CHARLES W. RAINER
BY Ronald T. Reiling
ATTORNEY United States Patent Office 3,457,937
Patented July 29, 1969

3,457,937

FLUID CIRCUIT

Charles W. Rainer, Anoka, Minn., assignor to Honeywell Inc., Minneapolis, Minn., a corporation of Delaware Filed Aug. 15, 1967, Ser. No. 660,684
Int. Cl. F15c *1/12*
U.S. Cl. 137—81.5 6 Claims

ABSTRACT OF THE DISCLOSURE

A fluid circuit for achieving reliable switching of a bistable fluid element comprising two proportional fluid amplifiers interconnected in a positive feedback configuration so as to produce a large well-defined switching signal when supplied with a small input signal.

The invention herein described was made in the course of or under a contract or subcontract thereunder, with the Department of the Air Force.

Background of the invention

This invention relates generally to fluid handling apparatus, and more specifically to fluidic switching circuits.

Fluid amplifiers and various other fluidic devices have been known in the art for some time. However, only recently has the fluidics art advanced to the point that complete systems utilizing fluid components are feasible. The recent interest in fluid systems design has increased the need for more basic and versatile fluidic circuits. In many of the fluid systems of interest it is required that bistable fluid elements be switched precisely and reliably with small switching signals. It is further required that the switching of these elements be as immune to noise as possible. Therefore, an increasing need exists for effective fluidic circuits for performing this switching function.

A common prior art solution to the problem of switching a bistable element with a small fluid input signal has been to amplify the input signal by means of a cascade of proportional amplifiers. In this technique, the required number of stages of amplification is that necessary to amplify the input signal to a magnitude sufficient to switch the bistable element. If the input signal is very small, a substantial number of fluid amplifiers is required to achieve sufficient amplification. The use of a large number of fluid amplifiers is undesirable because each additional amplifier increases the cost and complexity of the circuit in which it is used. The use of a large number of fluid amplifiers is further undesirable because each amplifier is a potential noise source in itself. Thus, the greater the number of amplifiers in the circuit, the greater the noise producing potential of the circuit. Any noise in the circuit is amplified by each successive stage of amplification and causes the bistable element to be unstable at switching signals near its switching threshold.

An additional disadvantage to this technique results from the fact that present bistable fluid elements switch in response to a range of values of switching signals. Further, the precise value of the switching signal at which a bistable element will switch is somewhat dependent upon the length of time that the signal has been applied to the element. A bistable element will, therefore, switch at different values of the switching signal dependent on the rate at which the value of the switching signal is changing. A cascade of a substantial number of proportional amplifiers does not produce a sufficiently fast rising signal to provide for precise switching of a bistable element.

It is apparent that this prior art switching technique is not generally satisfactory for use in modern refined fluid systems.

Summary of the invention

The applicant's fluidic switching circuit comprises first and second proportional fluid amplifiers, each having an outlet passage connected to a control port of the other such that positive feedback paths are provided. In addition, means is provided for supplying a pressure differential input signal between a control port of the first amplifier and a noncorresponding control port of the second amplifier. The circuit provides a pressure differential output signal between an outlet passage of the first amplifier and the noncorresponding outlet passage of the second amplifier. A stage of proportional amplification may be provided between the signal source and the input control ports of the first and second proportional amplifiers to provide for trimming and conditioning the input signal.

In accordance with the teachings of this invention, reliable and precise switching of a bistable fluid element is accomplished with a minimum amount of hardware thus reducing the cost and complexity of the circuit. The use of a minimum amount of hardware further results in a minimum potential for the introduction of noise into the circuit. The applicant's utilization of positive feedback provides the circuit with extremely high gain at the desired switching point thereby providing reliable and precise switching of a bistable element. In addition, the applicant's unique circuit is very stable because the gain of the circuit is greatly reduced on either side of the desired switching point.

Brief description of the drawing

The single figure of the drawing is a schematic representation of a preferred embodiment of a fluidic switching circuit in accordance with the applicant's invention.

Description of the preferred embodiment

Reference numeral 10 generally refers to a preferred embodiment of the applicant's switching circuit. Reference numeral 11 refers to a first proportional amplifier having a power nozzle 12, a pair of opposing control ports 13 and 14 and a pair of outlet passages 15 and 16. Power nozzle 12 is supplied with fluid under pressure from a fluid source 17 by means of a conduit 18. Control ports 13 and 14 are connected to any suitable source of a pressure differential control signal (not shown) by means of conduits 19 and 20 respectively. The control signal source may, for example, be a portion of a larger fluidic system.

Outlet passage 15 is connected to a control port 21 of a second proportional fluid amplifier 22 by means of a conduit 23. Amplifier 22 also has a second control port 24 which opposes control port 21, a power nozzle 25 and a pair of outlet passages 26 and 27.

Outlet passage 16 of amplifier 11 is connected to a control port 28 of a third proportional fluid amplifier 29 by means of a conduit 30. Amplifier 29 also has another control port 31 which opposes control port 28, a power nozzle 32 and a pair of outlet passages 33 and 34. Amplifiers 22 and 29 are of substantially identical geometries.

Power nozzles 25 and 32 of amplifiers 22 and 29 are supplied with fluid under pressure from a fluid source 34 by means of conduits 35 and 36. Outlet passage 27 of amplifier 22 is connected to control port 31 of amplifier 29 by means of a conduit 37. Outlet passage 33 of amplifier 29 is connected to control port 24 of amplifier 22 by means of a conduit 38.

Reference numeral 40 refers to a bistable fluid amplifier having a power nozzle 41, a pair of opposing control ports 42 and 43 and a pair of outlet passages 44 and 45. Power nozzle 41 is supplied with fluid under pressure from a fluid source 46 by means of conduit 47. Control ports 42 and 43 are connected to outlet passages 26 of amplifier 22 and 34 of amplifier 29 by means of conduits 48 and 49 respectively. Outlet passages 44 and 45 of amplifier 40 are connected to any suitable utilization device (not shown) by means of conduits 50 and 51. The utilization device may, for example, be a portion of a larger fluidic system.

It should be noted that the use of separate fluid sources, such as 17, 34 and 46 as shown in the drawing, is not necessary for proper operation of the applicant's circuit. The circuit will operate equally as well if amplifiers 11, 22, 29 and 40 are supplied with fluid from a common source.

Referring now to the operation of circuit 10, fluid from fluid source 17 issues as a stream from power nozzle 12. In the absence of a pressure differential between control ports 13 and 14, the fluid stream from nozzle 12 will divide substantially equally between outlet passages 15 and 16, resulting in fluid being supplied to control ports 21 of amplifier 22 and 28 of amplifier 29 at substantially equal pressures.

Fluid from fluid source 34 issues from power nozzle 25 of amplifier 22 and power nozzle 32 of amplifier 29. As previously noted, amplifiers 22 and 29 are of substantially identical geometries. Therefore, in the presence of equal control pressures at control ports 21 and 28, outlet passage 27 of amplifier 22 and outlet passage 33 of amplifier 29 will receive fluid at substantially equal pressures. Since outlet passages 27 and 33 of amplifiers 22 and 29 are connected to control ports 31 and 24 of amplifiers 29 and 22 respectively, the pressures at control ports 24 and 31 will be substantially equal. Further, since the pressures in outlet passages 27 and 33 of amplifiers 22 and 29 are substantially equal, the pressures in outlet passages 26 and 34 will also be substantially equal. Thus, the absence of a pressure differential between control ports 13 and 14 of amplifier 11, there will be no pressure differential between outlet passages 26 and 34 of amplifiers 22 and 29.

Amplifier 40 is a bistable device, therefore, a fluid stream issuing from power nozzle 41 will be received substantially entirely by either outlet passage 44 or outlet passage 45. Consequently, fluid from source 46 issuing from power nozzle 41 is received either by outlet passage 44 or by outlet passage 45. A fluid stream issuing from power nozzle 41 can be switched from one outlet passage to the other by a pressure differential signal of the proper sense and magnitude between control ports 42 and 43. For example, assume that a stream issuing from power nozzle 41 is being received by outlet passage 44. The stream from power nozzle 41 can be switched to outlet passage 45 by supplying a fluid pressure to control port 42 which is sufficiently greater than the fluid pressure supplied to control port 43. However, in the absence of a control signal of the proper sense and magnitude, the fluid issuing from nozzle 41 will continue to be received in outlet passage 44. Conversely, if the fluid issuing from power nozzle 41 had initially been entering outlet passage 45, it would remain in that state until control port 43 was supplied with a pressure sufficiently greater than the pressure supplied to control port 42.

Control ports 42 and 43 are connected to receive fluid pressure differential signals from outlet passages 26 and 34 of amplifiers 22 and 29 respectively. Consequently, in the absence of a pressure differential between outlet passages 26 and 34, fluid from power nozzle 41 will continue to be received in the same outlet passage. Thus, in the absence of a pressure differential input signal between control ports 13 and 14 of amplifier 11, the output of amplifier 40 will not be switched.

Now assume that a small pressure differential input signal is applied between control ports 13 and 14 of amplifier 11. More specifically, assume that the pressure at control port 13 is slightly greater than the pressure at control port 14. This small pressure differential will be amplified by amplifier 11 and will appear as a larger pressure differential between outlet passages 15 and 16. More specifically, the pressure in outlet passage 16 will be larger than the pressure in outlet passage 15 by the product of the magnitude of the input pressure differential and the gain of amplifier 11. This larger fluid pressure differential signal is applied between control ports 21 and 28 of amplifiers 22 and 29 respectively. The result is that the pressure at control port 28 is increased and the pressure at control port 21 is decreased from the pressures thereat which resulted from the absence of a pressure differential between control ports 13 and 14 of amplifier 11. The increase in pressure at control port 28 of amplifier 29 results in a larger increase in pressure in outlet passage 33 due to the amplification of amplifier 29. This large pressure increase is transmitted to control port 24 of amplifier 22. Thus, the pressure at control port 21 of amplifier 22 is decreased while the pressure at control port 24 is greatly increased. This results in a very large pressure increase in outlet passage 26 and a very large pressure decrease in outlet passage 27. The very large pressure decrease in outlet passage 27 is transmitted to control port 31 of amplifier 29. This results in a very large pressure increase in outlet passage 33 and a very large pressure decrease in outlet passage 34.

Conduits 37 and 38 function as positive feedback paths since they serve to feed back control signals which continually tend to increase any pressure differential existing between outlet passages 27 and 33. Thus, the pressure differential between outlet passages 27 and 33 is transmitted to control ports 31 and 24 which, in turn, causes the pressure differential between outlet passages 27 and 33 to increase. Any pressure increase between outlet passages 27 and 33 is also accompanied by a corresponding pressure increase between outlet passages 26 and 34.

The positive feedback provided by conduits 37 and 38 causes circuit 10 to have extremely high gain when operating with input signals which are sufficiently small so as to cause output signals within the capabilities of amplifiers 22 and 29. When operating with larger input signals, the output signals are limited by the output capabilities of amplifiers 22 and 29. Amplifiers 22 and 29 are then said to be saturated. When amplifiers 22 and 29 are operating in a saturated state, an increase in the input signl will not result in an increase in the output signals. Therefore, the gain of circuit 10 is greatly decreased for larger input signals causing circuit 10 to be very stable.

A very small pressure differential between control ports 13 and 14 of amplifier 11 results in a very large pressure differential between outlet passages 26 and 34 of amplifiers 22 and 29. This large pressure differential is supplied to control ports 42 and 43 of bistable amplifier 40. Amplifier 40 is thus switched reliably and precisely with a very small pressure differential input signal. Reliable switching of amplifier 40 is accomplished with a minimum number of general purpose fluid elements. Further, since a minimum number of fluid elements is used in circuit 10, there is a minimum potential for the introduction of noise into the circuit.

It should be noted that amplifier 11 is not required for proper operation of circuit 10. If the pressure differential input signals are of sufficient magnitude, they may be supplied directly to control ports 21 and 28 of amplifiers 22 and 29. However, amplifier 11 is shown since it has been found that superior performance of circuit 10 can be achieved if means is provided for trimming the signal applied to control ports 21 and 28.

I claim:

1. A fluidic circuit for switching a bistable fluid device comprising:

a first proportional fluid amplifier having a power nozzle, first and second opposing control ports and first and second outlet passages;

a second proportional fluid amplifier having a power nozzle, first and second opposing control ports and first and second outlet passages;

input means connected to the first control port of said first proportional fluid amplifier and the second control port of said second proportional fluid amplifier;

means connecting the second outlet passage of said first proportional fluid amplifier to the first control port of said second proportional fluid amplifier; and means connecting the first outlet passage of said second proportional fluid amplifier to the second control port of said first proportional fluid amplifier.

2. The fluidic circuit of claim 1 wherein said input means includes a third proportional fluid amplifier.

3. The fluidic circuit of claim 1 wherein fluid supply means is connected to the power nozzles of said first and second proportional fluid amplifiers.

4. A high gain fluid switching circuit comprising:

a first proportional fluid amplifier having a power nozzle, first and second opposing control ports and first and second outlet passages;

a second proportional fluid amplifier having a power nozzle, first and second opposing control ports and first and second outlet passages;

input means connected to the first control port of said first proportional fluid amplifier and the second control port of said second proportional fluid amplifier;

means connecting the second outlet passage of said first proportional fluid amplifier to the first control port of said second proportional fluid amplifier;

means connecting the first outlet passage of said second proportional fluid amplifier to the second control port of said first proportional fluid amplifier;

a bistable fluid amplifier having a power nozzle, first and second opposing control ports and first and second outlet passages;

means connecting the first outlet passage of said first proportional fluid amplifier to the first control port of said bistable fluid amplifier; and means connecting the second outlet passage of said second proportional fluid amplifier to the second control port of said bistable fluid amplifier.

5. The high gain fluid switching circuit of claim 4 wherein said input means includes a third proportional fluid amplifier.

6. The high gain fluid switching circuit of claim 4 wherein fluid supply means is connected to the power nozzles of said first and said second proportional fluid amplifiers and the power nozzle of said bistable fluid amplifier.

References Cited

UNITED STATES PATENTS

| | | | |
|---|---|---|---|
| 3,117,593 | 1/1964 | Sowers | 137—81.5 XR |
| 3,128,039 | 4/1964 | Norwood | 137—81.5 XR |
| 3,191,611 | 6/1965 | Bauer | 137—81.5 |
| 3,285,264 | 11/1966 | Boothe | 137—81.5 |
| 3,299,255 | 1/1967 | Bauer | 137—81.5 XR |
| 3,348,562 | 10/1967 | Ogren | 137—81.5 |
| 3,369,557 | 2/1968 | Wood | 137—81.5 |

SAMUEL SCOTT, Primary Examiner